United States Patent
Faifer et al.

(10) Patent No.: US 7,741,833 B1
(45) Date of Patent: Jun. 22, 2010

(54) NON CONTACT METHOD AND APPARATUS FOR MEASUREMENT OF SHEET RESISTANCE OF P-N JUNCTIONS

(75) Inventors: Vladimir Faifer, San Jose, CA (US); Phuc Van, San Jose, CA (US)

(73) Assignee: Ahbee 1, L.P., Los Altos, CA (US)

( * ) Notice: Subject to any disclaimer, the term of this patent is extended or adjusted under 35 U.S.C. 154(b) by 327 days.

(21) Appl. No.: 11/498,610

(22) Filed: Aug. 2, 2006

Related U.S. Application Data

(62) Division of application No. 10/688,766, filed on Oct. 15, 2003, now Pat. No. 7,362,088.

(51) Int. Cl.
*G01R 31/28* (2006.01)
(52) U.S. Cl. .................................................. 324/158.1
(58) Field of Classification Search ................. 324/765, 324/750–752, 158.1, 715–719; 257/48; 438/14–18; 250/243, 559.4, 559.27
See application file for complete search history.

(56) References Cited

U.S. PATENT DOCUMENTS

| | | | | | |
|---|---|---|---|---|---|
| 4,812,756 A | * | 3/1989 | Curtis et al. | ................ | 324/750 |
| 5,442,297 A | * | 8/1995 | Verkuil | ...................... | 324/702 |

* cited by examiner

*Primary Examiner*—Ha Tran T Nguyen
*Assistant Examiner*—Tung X Nguyen

(57) ABSTRACT

A contactless sheet resistance measurement apparatus and method for measuring the sheet resistance of upper layer of ultra shallow p-n junction is disclosed. The apparatus comprises alternating light source optically coupled with first transparent and conducting electrode brought close to the wafer, the second electrode placed outside of illumination area. Using the measurement of the surface photovoltage signals inside illuminated area and outside this area and its phase shifts, linear SPV model describing its lateral distribution the sheet resistance and p-n junction conductance is determined.

1 Claim, 7 Drawing Sheets

NON CONTACT METHOD AND APPARATUS FOR MEASUREMENT OF SHEET RESISTANCE OF P-N JUNCTIONS

RELATED APPLICATIONS

U.S. application Ser. No. 11/498,610 Non-contact method and apparatus for measurement of sheet resistance of P-N junctions filed on Aug. 2, 2006, is a division of U.S. application Ser. No. 10/688,766 filed on Oct. 15, 2003, now U.S. Pat. No. 7,362,088.

BACKGROUND OF THE INVENTION

The present invention relates to the measurement of the sheet resistance in the upper layer of p-n junction.

Advances in semiconductor technology increase requirements to monitor epi and ion implant sheet resistance, Rs, in the range 50-5000 ohms/square.

Currently 4-point probe technique is widely used for sheet resistance measurement. In the case of ultra shallow p-n junctions this technique has disadvantages: mechanical probes can poke through the implant layer; and probe pressures necessary for making ohmic contact with an implant layer can create P-N junction leakage between the implant layer and the underlying opposite conductivity substrate.

For these reasons, the 4-point probe techniques are inadequate for the requirements of ultra shallow P-N junction monitoring needs.

Non-contact surface photovoltage (SPV) technique can be used for measurement of the sheet resistance. SPV is the change of the near surface bad bending or surface barrier under intensity modulated illumination. As usually SPV is picked up by transparent and conducting electrode brought near wafer surface illuminated area and used for measurement of the minority carrier diffusion length, near surface lifetime and doping level. In the case of strong inversion (for example if top surface of oxidized wafer p-type conductivity is charged with positive ions) SPV can propagate outside of illuminating area due to lateral diffusion and the drift of the electrons and holes [V. N. Ovsyuk. Lateral diffusion of the minority carriers in thin semiconductor films, Sov. Phys. Semicond., v. 16, p. 2146 (1982)].

The theory and experimental evidence of SPV propagation outside the illumination area in the silicon wafers with strong inversion surface condition was published in V. Faifer et. al. Measurement of the diffusion length with improved spatial resolution, *Proceedings of 24th ESSDERC'94*, Edinburgh, p. 601 (1994). The propagating of SPV outside the illumination area strongly depends on the sheet resistance of inversion layer or upper layer of p-n junction. The SPV equation described in this paper can be used also for calculation of SPV spatial distribution as function of coordinate x, y, light modulating frequency, sheet resistance and conductance in the case of silicon wafers in strong inversion or ultra shallow p-n junctions.

The non contact SPV technique for measurement of sheet resistance in ultra shallow p-n junctions was proposed in U.S. Pat. No. 5,442,297 to Roger L. Verkuil, in 1995. This technique is based on the measurement of surface photovoltage (SPY) signals outside a local illumination area. To detect the attenuation and phase monitoring the apparatus include two conducting rings placed in the vicinity of the wafer surface outside the illumination area. Using the measurement of two AC SPV signals outside the illumination region and junction capacitance data the sheet resistance can be calculated.

This technique has follows disadvantages: since only attenuated SPV signals are measured outside the illumination area this approach can not provide good enough spatial resolution and high sensitivity for measurements of sheet resistance Rs<400 Ohms/square in ultra shallow P-N junction with high dose of implant. The measurement is based on small signal linear SPV theory. According to this theory SPV signal should be linear versus light flux not only outside illumination area but also inside this area. The technique presented in U.S. Pat. No. 5,442,297 uses measurement only outside illumination area. The calculation of sheet resistance is based on simplified model valid only for infinitely thin metal rings electrodes. As a result this model will give additional systematic error since capacitance of these thin electrodes should depends non linear on its distance from the wafer surface and linearity condition does not checked within illumination area. This probe configuration does not allow produce accurate measurement close to the edge of the wafer.

The advantages of present invention are to provide a method and apparatus for accurate measurements of sheet resistance of less than 400 Ohms/square with improved spatial resolution and sensitivity.

SUMMARY OF THE INVENTION

An object of this invention is to provide a non-contact sheet resistance apparatus for measurement for low medium and high dose implant layers. The present embodiment of the invention apparatus includes means for illumination area of semiconductor structure, a transparent and conducting electrode installed near the surface of the semiconductor wafer directing light onto its surface and detecting SPV signal from said area. The present invention also includes a second electrode detecting SPV signals outside the illumination area. The second electrode can be a metal ring coaxial with transparent and conducting disk of the first electrode. The second electrode can be a metal arc, which installed to be under the wafer, even if the light spot and transparent electrode are located at the edge of the wafer. Using this configuration of the second electrode, the edge effect can be significantly decreased.

Another object of the invention is to provide a method for measurement of sheet resistance. To obtain accurate measurements, the intensity of the light is adjusted to obtain the linear dependence of SPV signal from transparent electrode versus light flux.

The first method uses measurement of the SPV signal only from the first electrode. This method requires the calibration using the wafer with known sheet resistance. The method is based on comparison of SPV signal for wafer with unknown sheet resistance and calibration wafer with Rs measured using 4-point probe. This calibration wafer should have thick enough upper layer of p-n junction to get accurate 4 point probe measurement. The procedure of measurement includes the following steps:
  a) Illumination the area of the semiconductor structure with known sheet resistance through transparent electrode with intensity modulated light;
  b) Measurement of the SPV signal from transparent electrode;
  c) Adjustment of the light flux to get linear dependence of the SPY signal versus light flux;
  d) Measurement of SPV signals Vs0;
  e) Measurement of SPV signal Vs1 at the same conditions for wafer with unknown Rs;
  f) Determination of the sheet resistance using measured RATIO=Vs1/Vs0, and the calculated curve or table RATIO (Rs).

The second method uses measurement of the SPV signals from the first electrode and second electrodes and provides the measurement of the sheet resistance without calibration sample. The procedure of measurement includes the following steps:

a) Illumination the area of the semiconductor structure through transparent first electrode with intensity modulated light at maximum frequency, Fmax, corresponding bandwidth of SPV preamplifier and lock-n amplifier;
b) Measurement of the SPV signal, Vs1, from transparent electrode;
c) Adjustment of the light flux to get linear dependence of the SPV signal, Vs1, versus light flux;
d) Measurement of SPV signals, Vs1 and Vs2 from the transparent and not transparent electrodes;
e) If Vs1/Vs2>5 decreasing light modulating frequency to get the ratio of SPV signals RATIO=Vs1/Vs2<5 and measurement of Vs1 and Vs2 at this frequency;
g) Determination of the sheet resistance using measured RATIO=Vs1/Vs2, and the calculated curve or table RATIO (Rs).

The third method uses measurement of the SPV signals and phase shifts from the first and second electrodes and provides the measurement of the sheet resistance and conductance of p-n junction. The procedure of measurement includes the following steps:

a) Illumination the area of the semiconductor structure through transparent first electrode with intensity modulated light at maximum frequency, Fmax, corresponding bandwidth of the SPV preamplifier and lock-in amplifier;
b) Measurement of the SPV signal, Vs1, from transparent electrode;
c) Adjustment of the light flux to get linear dependence of the SPV signal, Vs1, versus light flux;
d) Measurement of SPV signals and its phase shifts, Vs1, Θ1 and Vs2, Θ2 from first transparent and second non transparent electrodes;
e) If Vs1/Vs2>5 decreasing the light modulating frequency to get the ratio of SPV signals RATIO=Vs1/Vs2<5 and measurement of Vs1,Θ1 and Vs2,Θ2 at this frequency;
f) Determination of the sheet resistance Rs and junction conductance Gs using measured SPV signals and its phase shifts, Vs1,Θ1 and Vs2,Θ2.

DETAILED DESCRIPTION OF THE APPARATUS AND METHOD

Figure 1:
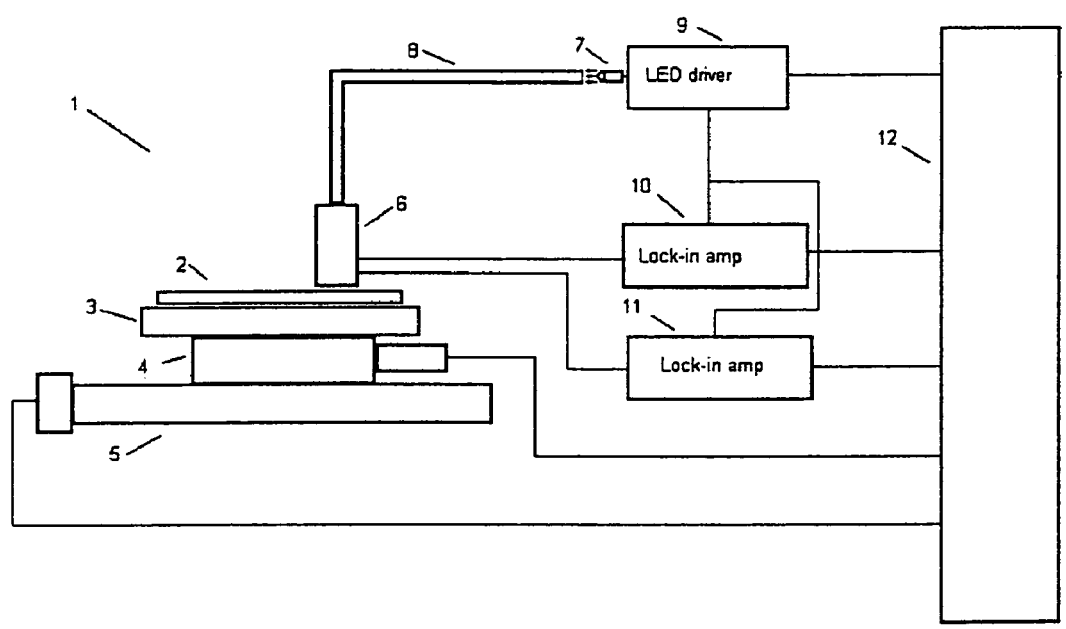
FIG. 1 is a pictorial view of the present embodiment of the invention.

In FIG. 1, a contactless sheet resistance measurement apparatus 1 is shown. Wafer 2 is placed on a wafer chuck 3. The wafer chuck is placed on the rotary stage 4. The rotary stage 4 is installed on the linear stage 5. The apparatus comprises an SPV probe 6, which is placed close to the wafer surface and optically coupled through fiber bundle 8 with the LED 7, connected to the LED driver 9. Two electrical outputs of the SPV probe 6 are connected to the lock-n amplifiers 10 and 11. Lock-in amplifiers 10 and 11, step motors of stages 4 and 5 are electrically connected to interface and computer 12.

Figure 2:
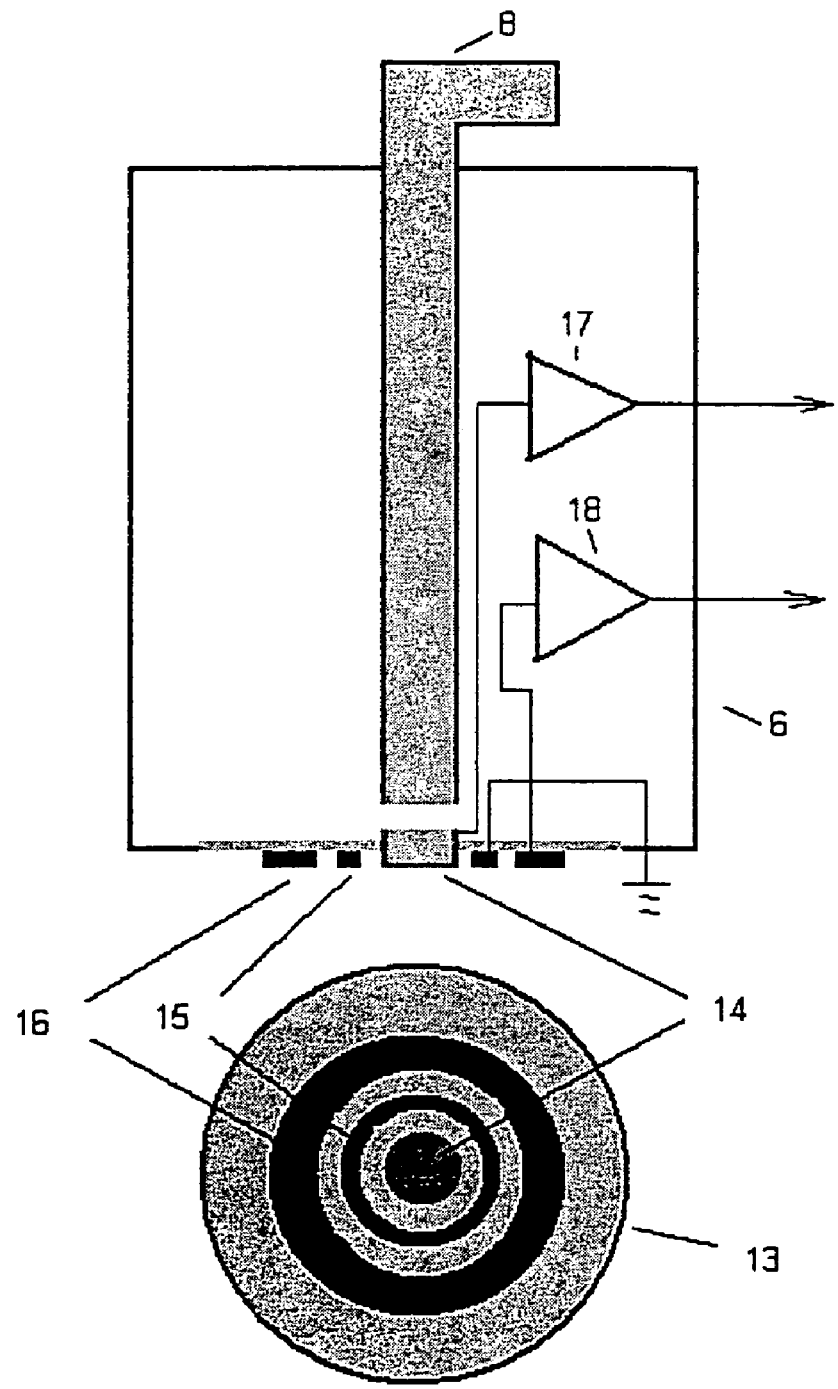
FIG. 2 is a pictorial view of a first SPV probe configuration.

SPV probe 6 represented at FIG. 2 includes dielectric ring 13, a glass disk with transparent and conducting ITO coating 14, two metal electrodes like the rings 15 and 16. Conducting layer of glass disk 14 is connected to preamplifier 17, metal electrode 15 is grounded and metal electrode 16 is connected to the preamplifier 18. The output of preamplifier 17 is connected to the lock-in amplifier 10 and output of preamplifier 18 is connected to the lock-in amplifier 11.

Figure 3:
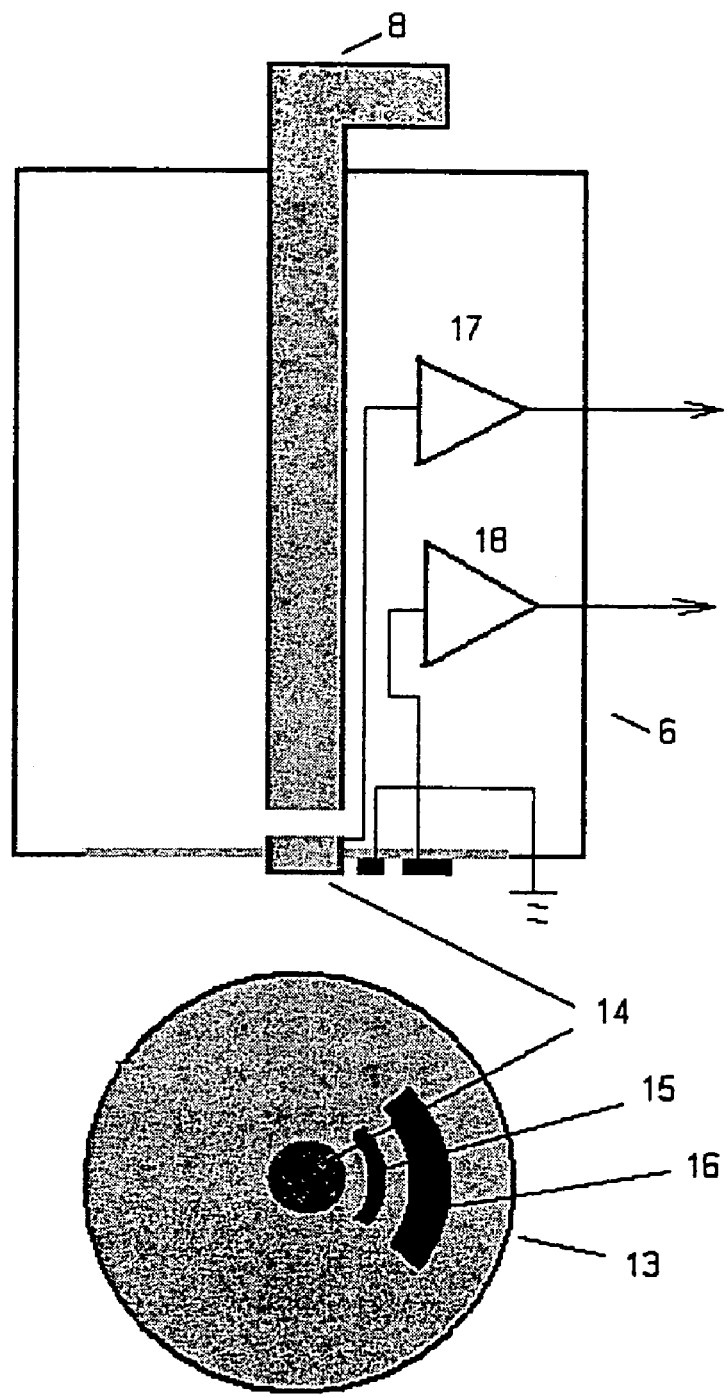
FIG. 3 is a pictorial view of a second SPV probe configuration.
Figure 4:
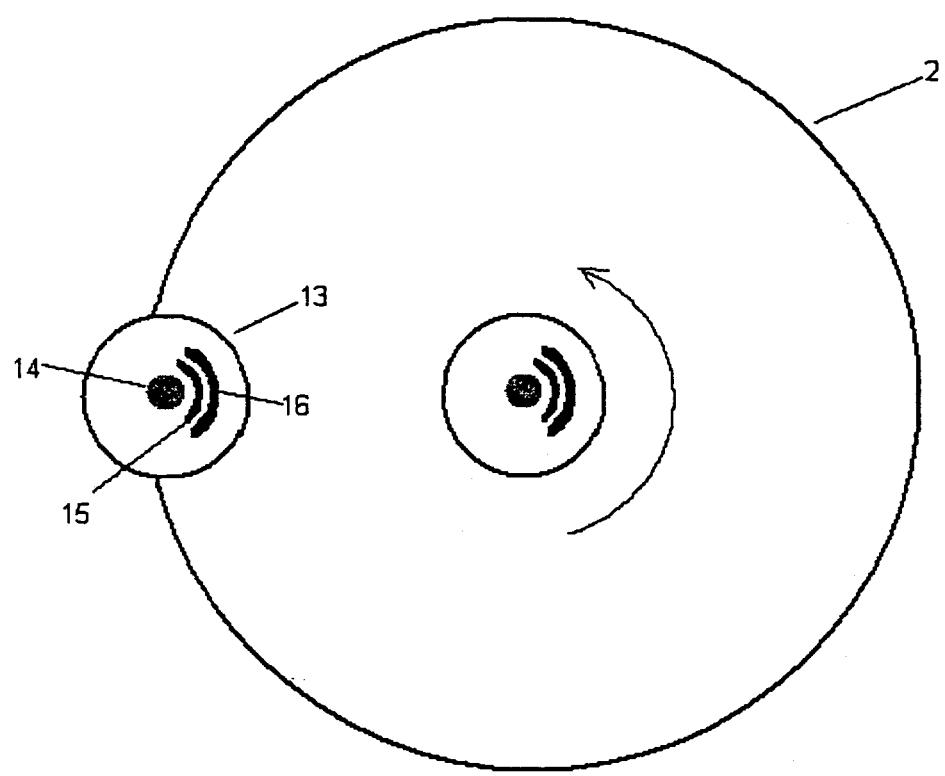
FIG. 4 is a pictorial view of the configuration of SPV electrodes with respect to the wafer.

SPV probe 6 represented at FIG. 3 includes dielectric ring 13, a glass disk with transparent and conducting ITO coating 14, two metal electrodes like the part of the ring 15 and 16. Conducting layer of glass disk 14 is connected to preamplifier 17, metal electrode 15 is grounded and metal electrode 16 is connected to the preamplifier 18. The output of preamplifier 17 is connected to the lock-in amplifier 10 and output of preamplifier 18 is connected to the lock-in amplifier 11. As shown at FIG. 4 the SPV probe is installed to provide the electrodes 15 and 17 inside the wafer, when transparent electrode 14 is close to the edge of the wafer.

The method of measurement is based on the solution of the equation for SPV value as function of coordinate x,y, derived in publication the *Proceedings of 24$^{th}$ ESSDERC'94*, Edinburgh, p. 601 (1994). After some modification the equation can be written as:

$$\frac{\partial^2 v_{SPV}}{\partial x^2} + \frac{\partial^2 v_{SPV}}{\partial y^2} = Rs \cdot Cs \cdot \frac{\partial v_{SPV}}{\partial t} + Rs \cdot G \cdot v_{SPV} - q - \varphi \cdot (1 - R) \cdot Rs \quad (1)$$

where:
$v_{SPV}(x,y,t)$ is SPV value as function of coordinates x,y;
$\phi(x,y,t)$ is the intensity of light flux;
Rs is the sheet resistance of the upper layer of p-n structure;
Cs is the capacitance of p-n junction per unit area;
G is the conductivity of p-n junction per unit area;
R is reflectivity of semiconductor.

The conductivity of p-n junction can be determined as:

$$G = \frac{I_0 \cdot q}{k \cdot T} \quad (2)$$

where
q is charge of the electron;
k is Boltzman constant;
T is the temperature;
Io is the prefactor in formula of current, I, versus voltage, V, of p-n junction:

$$I = I_0 \cdot [\exp(q \cdot V/kT) - 1] \quad (3)$$

The capacitance of the p-n junction can be calculated using formula:

$$Cs = \frac{\sqrt{\frac{\varepsilon_{Si}\varepsilon_0 q^2 N}{2kT}}}{\sqrt{2\ln\left(\frac{N}{ni}\right) + \ln\left(\ln\left(\frac{N}{ni}\right)\right)}} \qquad (4)$$

where:
$\varepsilon_0$ is the permittivity of vacuum;
$\varepsilon_{SI}$ is the permittivity of silicon;
q is the magnitude of electronic charge;
kT is the thermal energy;
ni is the intrinsic concentration of charge carriers in semiconductor; and
N is concentration of the majority carriers in semiconductor substrate.

The SPV signal can be calculated using the formula:

$$V_{SPV}(t) = Const \int_S \int v_{SPV}(x, y, t)dxdy \qquad (5)$$

where S is the area of electrode, Const is the value, which depends on the air gap between electrode and the semiconductor surface, the gain of amplification of the preamplifier and others parameters.

In the case of sinusoid modulated light SPV signal can be represented as:

$$V_{SPV}(t) = V_S \cdot \exp(j\omega \cdot t) = |Vs|\exp(j\theta)\exp(j\omega \cdot t) \qquad (6)$$

where $|Vs|$, $\theta$ are the magnitude and phase shift of SPV signal, Vs, $\omega=2\pi F$, F is light modulating frequency.

Using the equation (1), formula (5) we can get the formulas for SPV signals from electrodes installed inside, Vs1, and outside, Vs2, the illumination area:

$$V_{S1} = \frac{q\Phi R_s}{k^2}\left[1 - \frac{2}{kR_0}\frac{I_1(kR_0)K_1(kR_0)}{I_0(kR_0)K_1(kR_0) + I_1(kR_0)K_0(kR_0)}\right] \qquad (7)$$

$$V_{S2} = 2q\frac{\Phi R_s}{k^3 R_0^2}\frac{I_1(kR_0)[R_1 K_1(kR_1) - R_2 K_1(kR_2)]}{I_0(kR_0)K_1(kR_0) + I_1(kR_0)K_0(kR_0)} \qquad (8)$$

where $$k=\sqrt{RsG+j\omega RsCs} \qquad (9)$$

$I_0(z)$, $I_1(z)$, are the modified Bessel function of the first kind;
$K_0(z)$, $K_1(z)$ are the modified Bessel function of the second kind;
$R_0$ is the radius of the first transparent electrode;
$R_1$, $R_2$ are the inner and outer radiuses of the second non transparent electrode;
$\Theta$ is the effective light flux propagating inside semiconductor.

If light modulating frequency is high enough, $\omega \gg G/Cs$, SPV signal does not depend on leakage of p-n junction and sheet resistance can be calculated using measured values of the magnitudes of SPV signals from first transparent electrode, Vs1, and second non transparent electrode and equation:

$$\frac{Vs1}{Vs2} = \left|\frac{V_{S1}}{V_{S2}}\right| = \left|\frac{1}{2}kR_0^2 \frac{K_1(kR_0)I_0(kR_0) + K_0(kR_0)I_1(kR_0) - (1/2kR_0)K_1(kR_0)I_1(kR_0)}{I_1(kR_0)[R_1 \cdot K_1(kR_1) - R_2 K_1(kR_2)]}\right| \qquad (10)$$

where Cs is calculated using formula (5);

$$k=\sqrt{j2\pi F RsCs}$$

For leaky p-n junctions and low frequency, F, sheet resistance and conductance can be calculated using the measured magnitudes and phase shifts of SPV signals Vs1,θ1 and Vs2, θ2, and a set of equations:

$$\frac{Vs1}{Vs2} = \left|\frac{V_{S1}}{V_{S2}}\right| = \left|\frac{1}{2}kR_0^2 \frac{K_1(kR_0)I_0(kR_0) + K_0(kR_0)I_1(kR_0) - (1/2kR_0)K_1(kR_0)I_1(kR_0)}{I_1(kR_0)[R_1 \cdot K_1(kR_1) - R_2 K_1(kR_2)]}\right| \qquad (11)$$

$$\theta_1 - \theta_2 = Arg\left[\frac{1}{2}kR_0^2 \frac{K_1(kR_0)I_0(kR_0) + K_0(kR_0)I_1(kR_0) - (1/2kR_0)K_1(kR_0)I_1(kR_0)}{I_1(kR_0)[R_1 \cdot K_1(kR_1) - R_2 K_1(kR_2)]}\right] \qquad (12)$$

Figure 5:
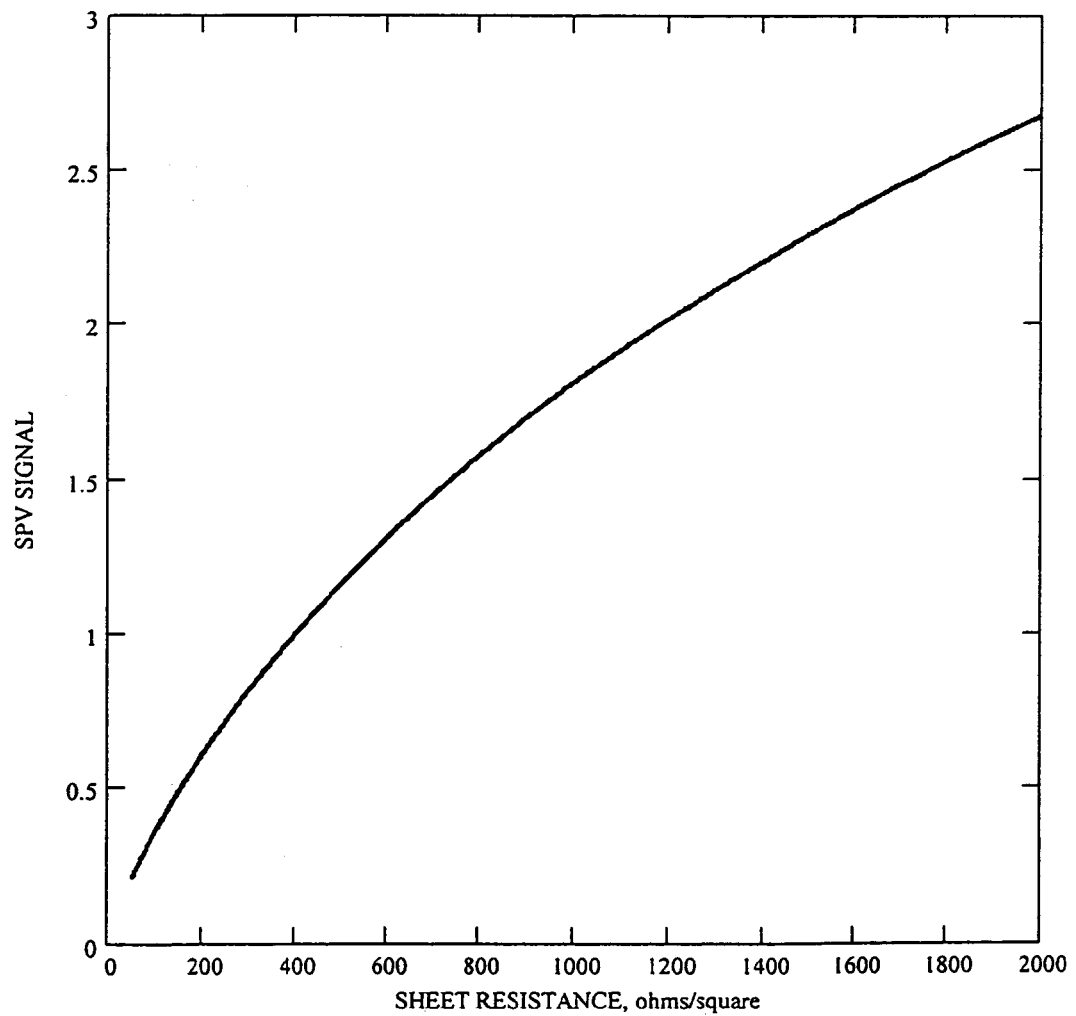
FIG. 5 is a pictorial view of the calculated dependence of the ratio of SPV signal from first electrode versus sheet resistance normalized on SPV signal for p-n junction with sheet resistance Rs=400 Ohms/square.

The results of calculation using formula (7) SPV signal from transparent electrode versus sheet resistance for light modulating frequency f=100 kHz and the diameter of transparent electrode 5 mm is represented at FIG. 5. This curve is normalized on SPV signal for p-n junction with sheet resistance Rs=400 Ohms/square. The substrate doping concentration is $10^{15}$ cm$^{-3}$.

Figure 6:
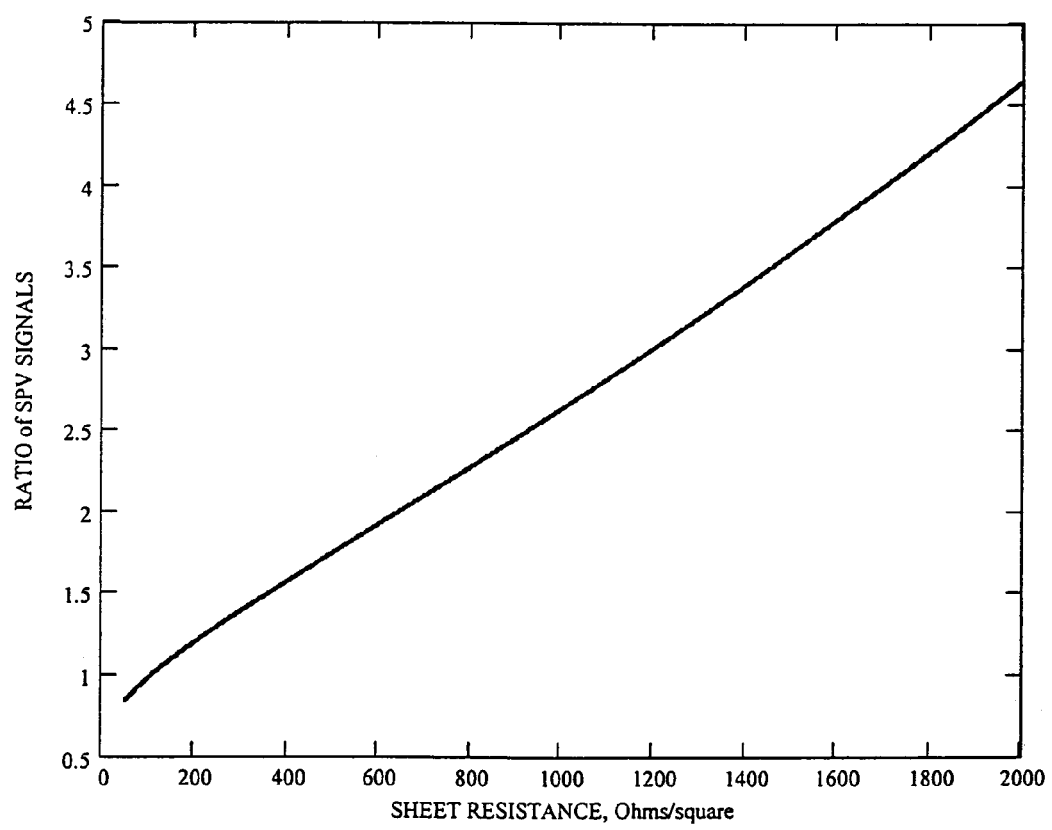
FIG. 6 is a pictorial view of the calculated dependence of the ratio of SPV signals from first and second electrodes versus sheet resistance.
Figure 7:
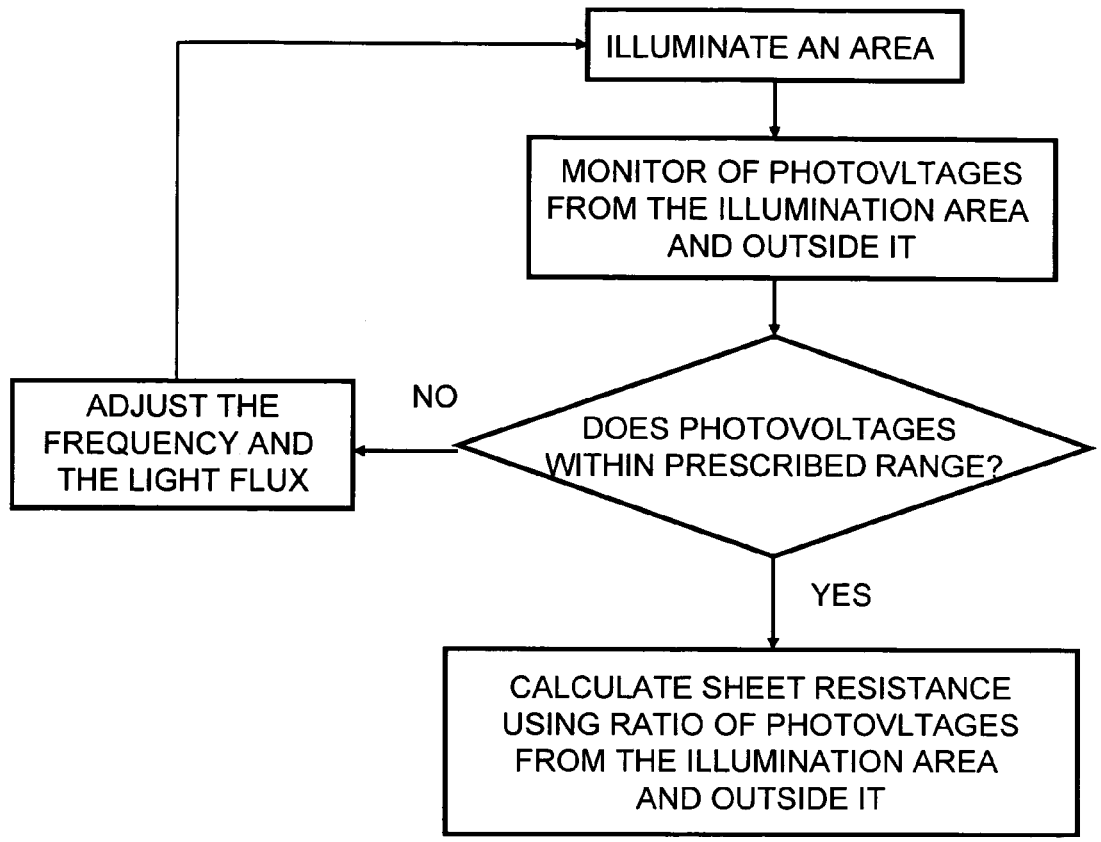
FIG. 7 is a flow chart of the steps in determing sheet resistance.

FIG. 6 shows the calculated using formula (10) dependence of the ratio of SPV signals, Vs1/Vs2, from first and second electrodes versus sheet resistance for light modulating frequency f=100 kHz, diameter of the transparent electrode is 5 mm, the inner and outer diameters of the metal ring electrode are 16 and 18 mm. The substrate doping concentration is $10^{15}$ cm$^{-3}$.

The first method uses measurement of the SPV signal from the first electrode. This method requires the calibration using the wafer with known sheet resistance. The method is based on comparison of SPV signal for wafers with unknown sheet resistance and calibration wafer with Rs measured using 4-point probe. This calibration wafer should have thick enough upper layer of p-n junction to get accurate 4 point probe measurement The procedure of measurement includes the following steps:
a) Illumination the area of the semiconductor structure with known sheet resistance through transparent disk 14 with intensity modulated light at frequency, f, from LED 17;
b) Measurement of the SPV signals Vs0 from transparent electrode 14;
c) Adjustment of the light flux to get linear dependence of the SPV signal Vs0 versus light flux;
d) Measurement of SPV signal Vs0; Measurement of SPV signal Vs1 at the same conditions for wafer with unknown Rs;
e) Determination of the sheet resistance using measured RATIO=Vs1/Vs0, and equation (7).

The second method uses measurement of the SPV signal from the first and second electrodes. The procedure of measurement includes the following steps:

a) Illumination the area of the semiconductor structure through transparent disk 14 from LED 17 with intensity modulated light at frequency, Fmax, corresponding to bandwidth of SPV preamplifier and lock-n amplifier;

b) Measurement of the SPV signal, Vs1, from transparent electrode;

c) Adjustment of the light flux to get linear dependence of the SPV signal, Vs1, versus light flux;

d) Measurement of SPV signals, Vs1 and Vs2 from electrodes 14 and 16 respectively using preamplifiers 17 and 18;

e) If Vs1/Vs2>5 decreasing of light modulating frequency to get the ratio of SPV signals RATIO=Vs1/Vs2<5 and measurement of SPV signals at this modulating frequency;

f) Determination of the sheet resistance using measured RATIO=Vs1/Vs2, and equation (10).

For leaky p-n junctions condition ω>>Gs/Cs can not be valid even for high frequency F>10 kHz. In this case the additional measurement of the SPV phase shift should be provided and Rs, Gs can be calculated using set of equations (11), (12), where Vs1, Vs2 and Θ1,Θ2 are the measured magnitudes and phase shifts of SPV signals from first transparent and second non transparent electrodes.

The third method uses measurement of the SPV signals and phase shifts from the first and second electrodes. The procedure of measurement includes the following steps:

a) Illumination the area of the semiconductor structure through transparent disk 14 from LED 17 with intensity modulated light at frequency, Fmax, corresponding the bandwidth of SPV preamplifier and lock-in amplifier;

b) Measurement of the SPV signal, Vs1, from transparent electrode;

c) Adjustment of the light flux to get linear dependence of the SPV signal, Vs1, versus light flux;

d) Measurement of SPV signals and its phase shifts, Vs1, Θ1 and Vs2,Θ2 from electrodes 14 and 16 respectively using preamplifiers 17 and 18;

e) If Vs1/Vs2>5 decreasing the light modulating frequency to get the ratio of SPV signals RATIO=Vs1/Vs2<5 and measurement Vs1 and Vs2 at this modulating frequency;

f) Determination of the sheet resistance Rs and junction conductance Gs using measured SPV signals and its phase shifts, Vs1,Θ1 and Vs2,Θ2 and set of equation (6) and (7).

What is claimed is:

1. A contactless sheet resistance measurement method, comprising the steps of:

illumination of the area of the semiconductor structure with known sheet resistance through a transparent electrode with intensity modulated light;

measurement of the SPV signal from the transparent electrode;

adjustment of the light flux to obtain linear dependence of the SPV signal versus light flux;

measurement of SPV signals Vs0;

measurement of SPV signal Vs1 at the same conditions for wafer with unknown Rs; and determination of the sheet resistance using measured RATIO=Vs1/Vs0, and the calculated curve or table RATIO(Rs).

\* \* \* \* \*